United States Patent [19]
Wong

[11] Patent Number: 5,923,955
[45] Date of Patent: Jul. 13, 1999

[54] FINE FLIP CHIP INTERCONNECTION

[75] Inventor: Kaiser H. Wong, Torrance, Calif.

[73] Assignee: Xerox Corporation, Stamford, Conn.

[21] Appl. No.: 09/085,867

[22] Filed: May 28, 1998

[51] Int. Cl.$^6$ .................................................. H01L 21/44
[52] U.S. Cl. ...................... 438/108; 438/118; 438/612; 438/613
[58] Field of Search .................................. 438/108, 118, 438/612, 613, 614, 615

[56] References Cited

U.S. PATENT DOCUMENTS

| | | | |
|---|---|---|---|
| 4,545,610 | 10/1985 | Lakritz et al. ........................... | 438/615 |
| 5,196,371 | 3/1993 | Kulesza et al. .......................... | 438/614 |
| 5,547,530 | 8/1996 | Nakamura et al. ...................... | 438/613 |
| 5,786,238 | 7/1998 | Pai et al. ................................. | 438/614 |

*Primary Examiner*—Kevin M. Picardat

[57] ABSTRACT

There is disclosed a process for creating a flip chip bonded combination for a first integrated circuit and a second integrated circuit. Creating a first connection means on each bonding pad of a first integrated circuit within a first wall structure and a second connection means on each bonding pad of a second integrated circuit within a second wall structure. Removing the second wall structure and partially placing each second connection means within the first wall structure over a respective connection means of the first integrated circuit.

12 Claims, 12 Drawing Sheets

FINE FLIP CHIP INTERCONNECTION

BACKGROUND OF THE INVENTION

This application is related to U.S. patent application Ser. No. 03/085847, "Fine Flip Chip Interconnection" Attorney docket No. D/98248 (Common Assignee) filed concurrently herewith.

This Application is related to flip chip bonding of two microchips and more particularly to fabrication of interconnections for bonding pads with a pitch less than 12 microns.

Typically, flip chip bonding is used when two chips have to be physically and electrically connected to each other. Due to the increasing demand for additional capacity or function on integrated circuit chips, the number of bonding pads and as a result, the number of interconnects of each chip needs to be increased. However, there is limited space at the edges of each chip. Therefore, in order to increase the number of the bonding pads, the pitch between the bonding pads needs to be decreased.

Conventional interconnection technologies such as wire bonding and tape automated bonding (TAB) are only capable of connecting bonding pads with a pitch of 75 microns or above. The finest achievable pitch for Anisotropic conductive Film (AFC) is about 50 to 75 microns. Traditionally, flip chip technology is able to connect 5 micron bonding pads with a 25 micron pitch and a 7 micron bump height. Bump height is referred to the height of the solder bump (interconnect) on each bonding pad and it is critical because the height of the two joining solder bumps keeps the two chips apart from each other. Typically, the solder bumps are created by electroplating, electroless plating, or dip soldering. However, neither approach is capable of producing bump pitch less than 25 microns.

It should be noted that fabricating a bonding pad with any size and pitch is possible. However, at fine pitches, it is the interconnect such as the solder bump that is problematic.

Figure 1:
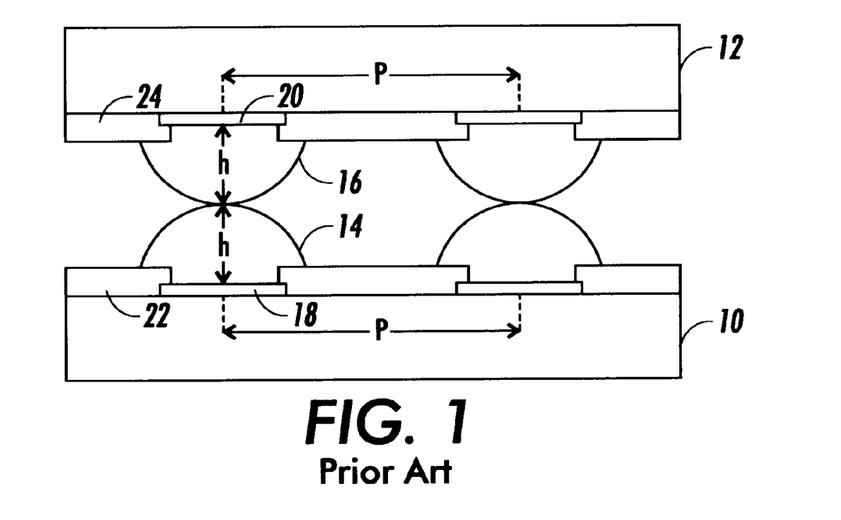
FIG. 1 shows a conventional flip chip technology.

Referring to FIG. 1, there is shown a conventional flip chip technology. In FIG. 1, there are two chips 10 and 12 which will be bonded together through the solder bumps 14 and 16 respectively. Each solder bump 14 and 16 is created over a bonding pad 18 and 20 respectively via electroplating, electroless plating, or dip soldering. Typically, the solder should be formed on the metal bonding pads and not on the oxide layers 22 and 24. However, since plating of the metal is continued to create the required height h, the solder bumps 14 and 16 overplate on the oxide layers 22 and 24 respectively. Due to the overplating of the solder bumps 14 and 16 onto the oxide layer 22 and 24, the pitch p of the bonding pads can not be reduced to less than 25 microns.

Figure 2:
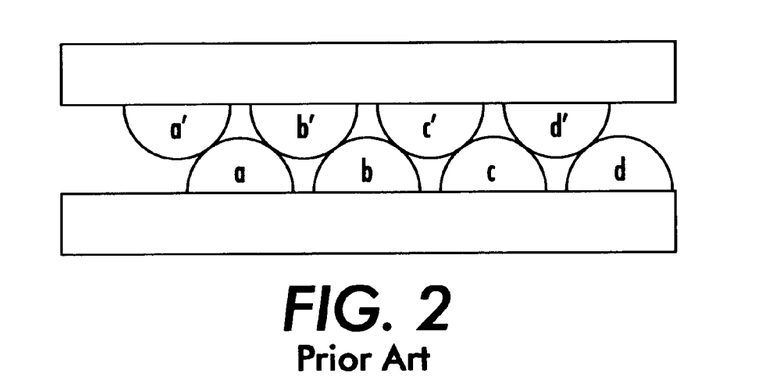
FIG. 2 shows an incorrect connection between the solder bumps due to misalignment.

In addition to the problem of reducing the pitch of the bonding pads, to a pitch less than 25 microns, the alignment between the interconnects of the two chips is also problematic. Due to a fine pitch such as 10 microns between the interconnects, any misalignment can create a bridge between the incorrect bonding pads. For example, referring to FIG. 2, there is shown a misaligned flip chip in which each solder bump a, b, and c touch two solder bumps a' and b', b' and c', and c' and d' respectively and create an undesirable bridge with solder bumps b', c' and d' respectively.

Furthermore, in a conventional flip chip bonding, the solder joints (two joined solder bumps) are exposed to air which can lead into the deterioration of the solder bumps due to the temperature and humidity.

It is an object of this invention to fabricate interconnections with a pitch less than 15 microns, provides an alignment means and seals the solder bumps of each chip to prevent corrosion.

SUMMARY OF THE INVENTION

According to the present invention, there is disclosed a process for creating a flip chip bonded combination for a first integrated circuit and a second integrated circuit. Creating a first wall structure around the bonding pads of the first integrated circuit and a second wall structure around the bonding pads of the second integrated circuit. Creating a first connection means on each bonding pad of the first integrated circuit within the first wall structure and a second connection means on each bonding pad of the second integrated circuit within the second wall structure. Removing the second wall structure and partially placing each second connection means within the first wall structure over a respective connection means of the first integrated circuit.

DESCRIPTION OF THE PREFERRED EMBODIMENT

Figure 3:
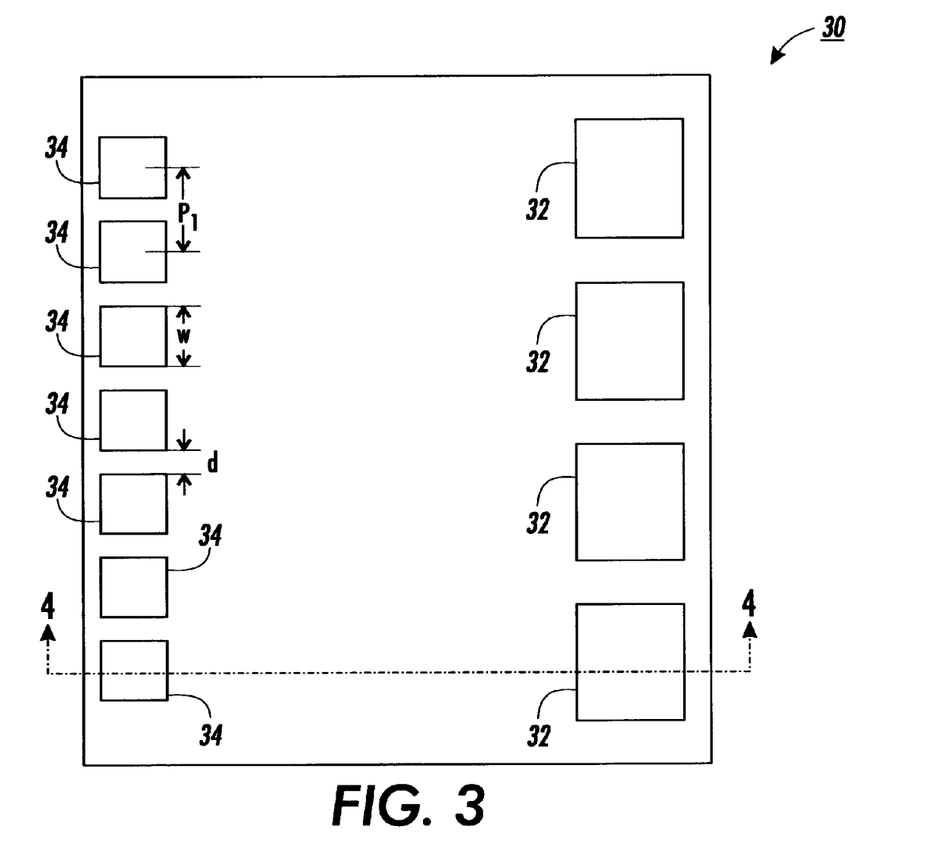
FIG. 3 shows a top view of one of the chips of this invention.

Referring to FIG. 3, there is shown a top view of an integrated circuit chip 30 which will be connected to another chip through flip chip bonding. The chip 30 has a set of large bonding pads 32, such as 75 X 75 microns with a pitch of 125 microns, and a set of fine pitch bonding pads 34. In the set of fine pitch bonding pads 34, the pitch "$p_1$" (distance from center of one bonding pad to the center of the adjacent bonding pad) is 12 microns, the distance "d" between two adjacent bonding pads is 3 microns and the width "w" of the bonding pad is 9 microns.

It should be noted that, the chip 30 has shown with both large bonding pads 32 and fine pitch bonding pads 34 to show the possibility of having different size bonding pads on the same chip. However, if one desires, the large bonding pads 32 can be eliminated and the chip can be fabricated with only fine pitch bonding pads 34.

Figure 4:
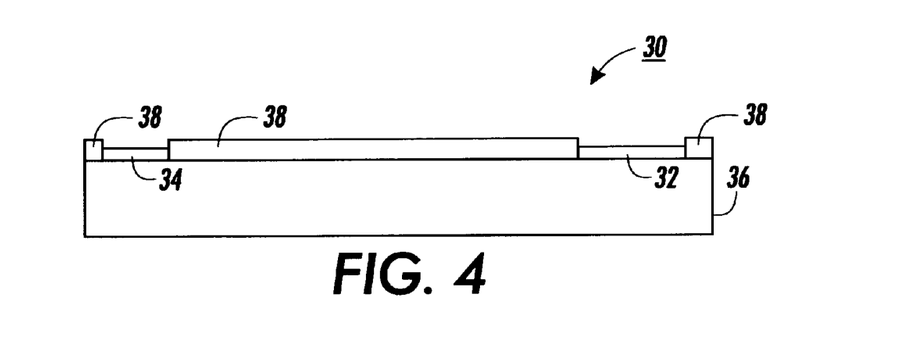
FIG. 4 shows a cross sectional view of FIG. 3 along the cutting plane 4—4.

Referring to FIG. 4, there is shown a cross sectional view of FIG. 3 along the cutting plane 4—4. Chip 30 is fabricated on a semiconductor substrate 36. A layer 38 of silicon oxide is used as a passivation layer over substrate.

Referring back to FIG. 3, in order to create an interconnect to act as a solder bump on each bonding pad 34 without overplating onto the allocated area of the adjacent bonding pads 34, there is a need to confine the interconnect to a desired area.

Figure 5:
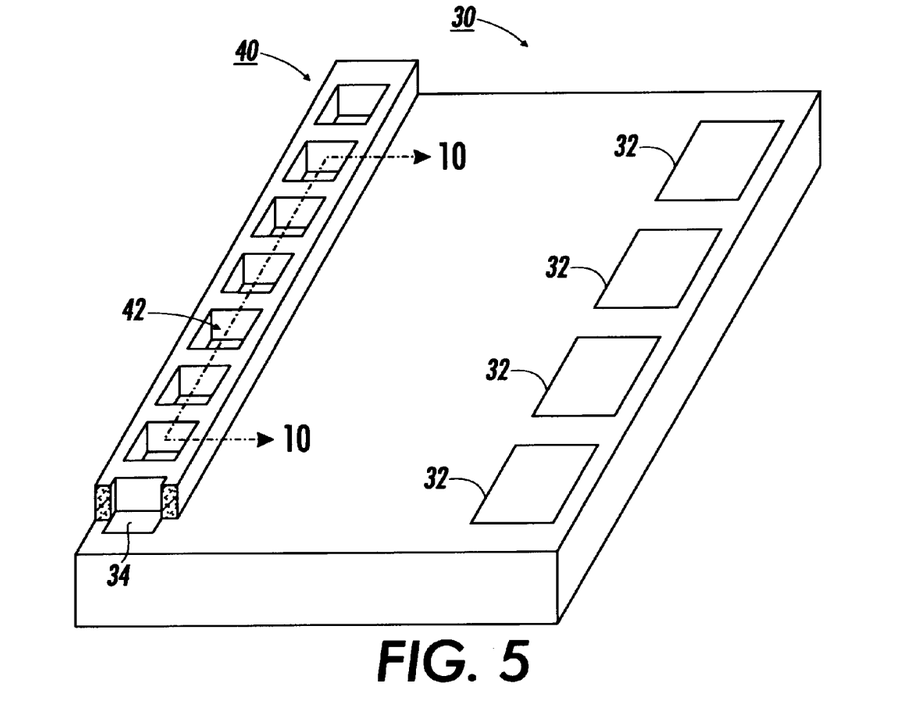
FIG. 5 shows an isometric view of the chip of FIG. 3 along with a polyimide wall structure used in this invention.

Referring to FIG. 5, there is shown an isometric view of the chip 30 of FIG. 3 with a wall structure 40 which has cavities 42 over the bonding pads 34 to confine the interconnect onto the bonding pads 34. Wall structure 40, is made of a layer of negatively photoimagable polyimide which is patterned to define and create an enclosed cavity 42 over each bonding pad 34.

Figure 6:
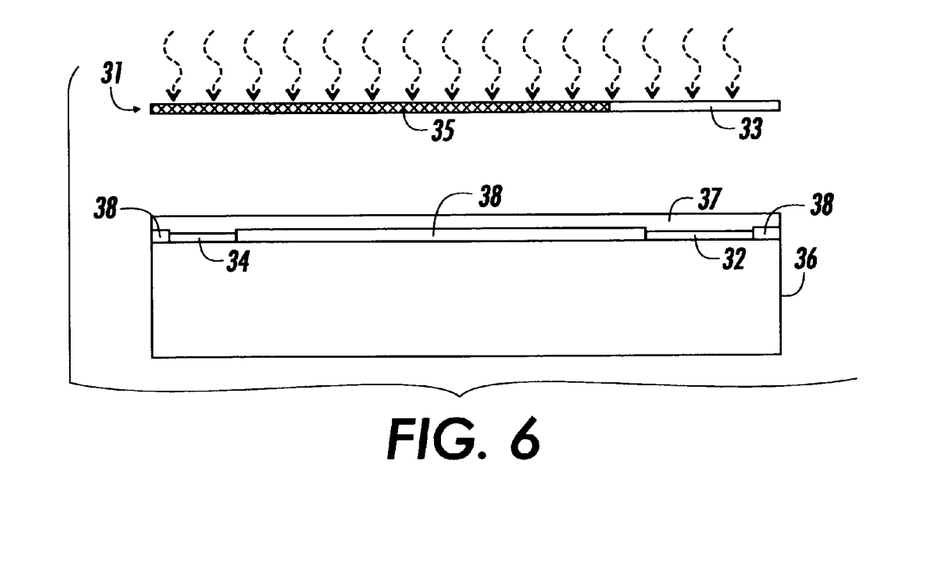
FIGS. 6 and 7 show the steps of placing a protective layer over the large bonding pads of FIG. 3.
Figure 7:
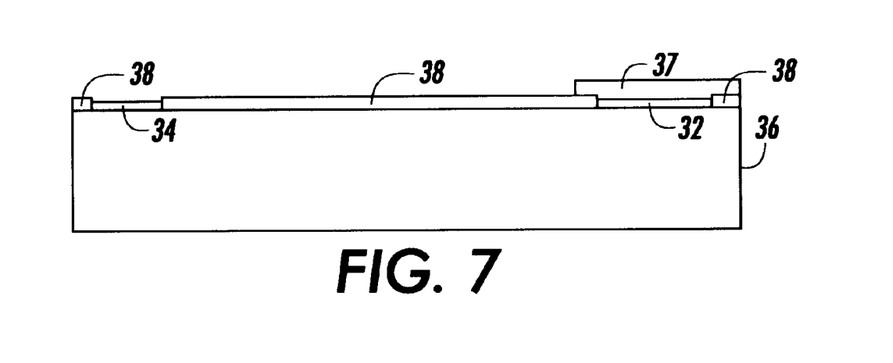

Prior to creating the wall structure 40, a protective layer 37 is placed over the bonding pads 32 as shown in FIGS. 6 and 7. By well known methods such as spinning, a 1–2 micron negatively photoimagable polyimide layer 37 is applied over the entire surface of the substrate 36. Subsequently, a mask 31 is placed over layer 37. Mask 31 has dark areas 35 to prevent UV light from reaching the polyimide layer 37 where it needs to be etched. It also has some clear areas 33 to allow light to pass through and shine on the polyimide layer 37 where it needs to be kept during the etching step. Then, chip 30 will be exposed to UV radiation through the mask 31. The patterned layer 37 is formed after it is exposed, developed by well known methods and cured at 320° C. for 2 hours in a vacuum oven.

Figure 8:
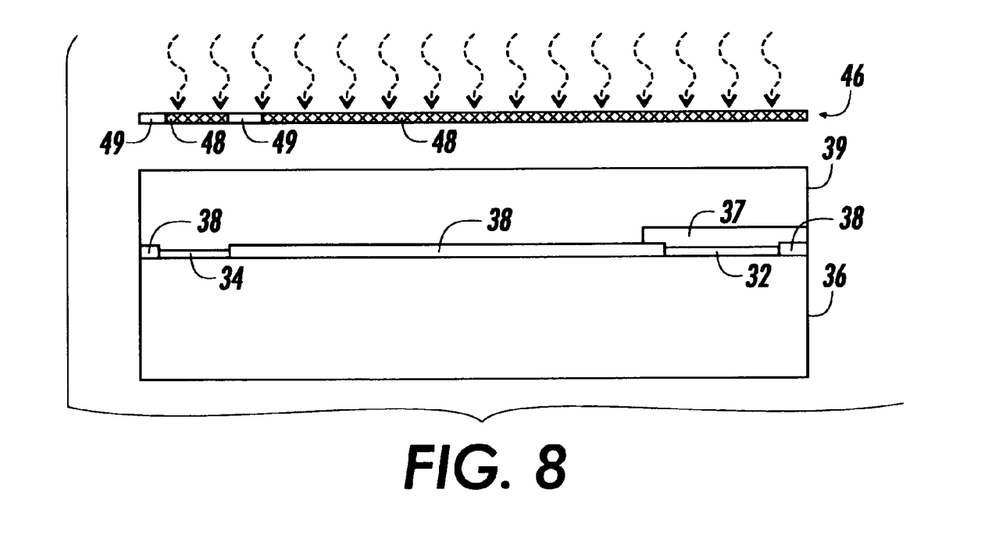
FIGS. 8 and 9 show the steps of creating a polyimide wall structure.
Figure 9:
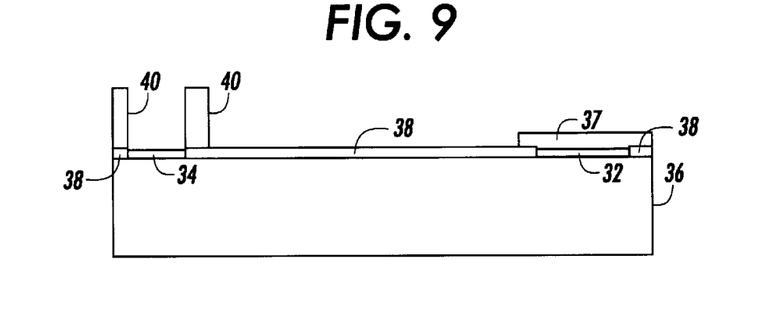

Referring to both FIGS. 8 and 9, there is shown the process of creating the wall structure 40. By well known methods such as spinning, a negatively photoimagable polyimide layer 39 is applied over the entire surface of the substrate 36 to cover the bonding pads 32 and 34, oxide layer 38, and the cured polyimide layer 37. The polyimide layer 39 has a thickness in the range of 13–20 microns. The range of the polyimide thickness is selected to provide the aspect ratio required to etch a cavity with a width such as 9 microns (width of the bonding pad). Also, the polyimide thickness depends on the thickness of metalization required in the following steps.

Subsequently, the polyimide layer 39 is patterned by well known methods. To pattern the polyimide layer 39, a mask 46 is placed over this layer 39. Mask 46 has dark areas 48 to prevent UV light from reaching the polyimide layer 39 where it needs to be etched. It also has some clear areas 49 to allow light to pass through and shine on the polyimide layer where it needs to be kept during the etching step. Then, chip 30 will be exposed to UV radiation through the mask 46. Wall structure 40 is formed after it is exposed, developed by well known methods and cured at 320° C. for 2 hours in a vacuum oven.

Polyimide is selected for the wall structure 40 of this invention, for two reasons. First, polyimide can provide a high thickness such as 13 microns. Second, due to mechanical properties of the polyimide, it can be used as a permanent structure. The polyimide wall structure 40 is used to define the boundaries of the bonding pads 32, keep the two chips of a flip chip bonding apart from each other and finally facilitate the alignment of the two chips.

Figure 10:
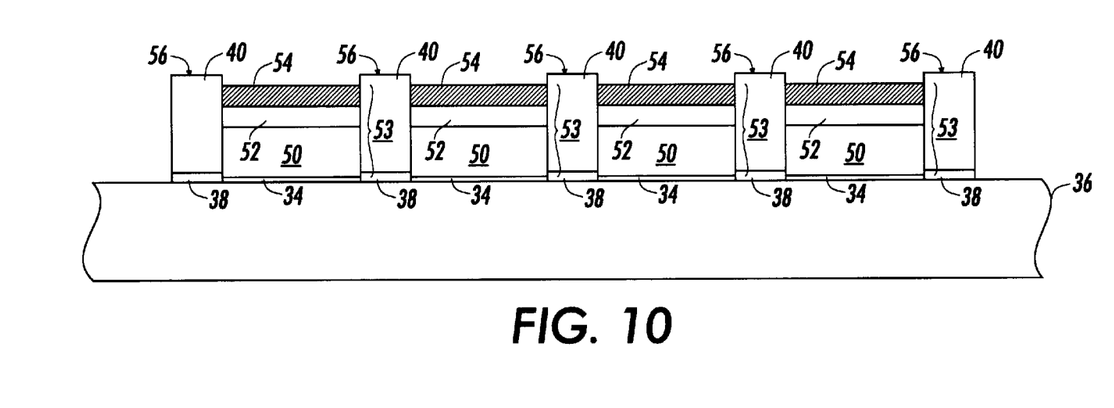
FIGS. 10 shows the fabrication of connection blocks on the fine pitch bonding pads.

Referring to FIG. 10, there is shown a cross sectional view of FIG. 5 along the cutting plane 10—10. Once the polyimide wall structure 40 is created, a 5 micron layer 50 of nickel is placed over the aluminum bonding pads 34 by well known process of electroless nickel plating. The nickel solution used in this step has a pH level of 4.5 to provide an environment, in which most alkaine sensitive dielectric are not significantly affected. The concept of electroless nickel plating is discussed at length by Kaiser Wong, Kirk Chi and Amikara Rangappan in their article "Application of Electroless Nickel Plating in the Semiconductor Microcircuit Industry", published in Plating and Surface Finishing Magazine, July 1988.

The nickel will be deposited onto the aluminum bonding pads 34. The wall structure 40 keeps the nickel plating precisely over the bonding pads 34 and prevent the nickel plating to overplate onto adjacent areas of the bonding pads 34. The 5 micron layer of nickel is thick enough to seal the aluminum bonding pads 34 from any material placed over the nickel layer 50.

Subsequently, a 2 micron layer 52 of copper is placed over the layer of nickel 50 by electroless plating. The copper solution used in this step has a pH level of less than 5 to be safe for the polyimide wall structure 40, polyimide protective layer 37, and the aluminum bonding pads 34. The aluminum bonding pads 34 are sealed by the nickel layer 50. However, for protection, the pH level of copper solution is selected to be low to prevent any damage to the aluminum bonding pads 34 in case any one of the aluminum bonding pads 34 is not completely sealed by the nickel layer 50.

Following the copper layer 52, a 2 micron layer 54 of tin is placed over the copper by electroless plating. The tin solution used in this step is acidic and it can damage the aluminum if reaches the aluminum bonding pads 34. However, the 5 micron layer of nickel and the 2 micron layer of copper should seal the aluminum bonding pads 34.

The total thickness of metalization (the three layers of nickel 50, copper 52, and tin 54) depends on the desired thickness for the polyimide wall structure 40. For a better solder joint, a thicker metalization can be used. After the three layers of nickel 50, copper 52, and tin 54 are deposited on the aluminum bonding pads 34 to create a connection block (interconnect) 53, the protective polyimide layer 37 is removed by oxygen plasma etch. During this etch, 1–2 micron of the wall structure 40 is also removed.

Figure 11:
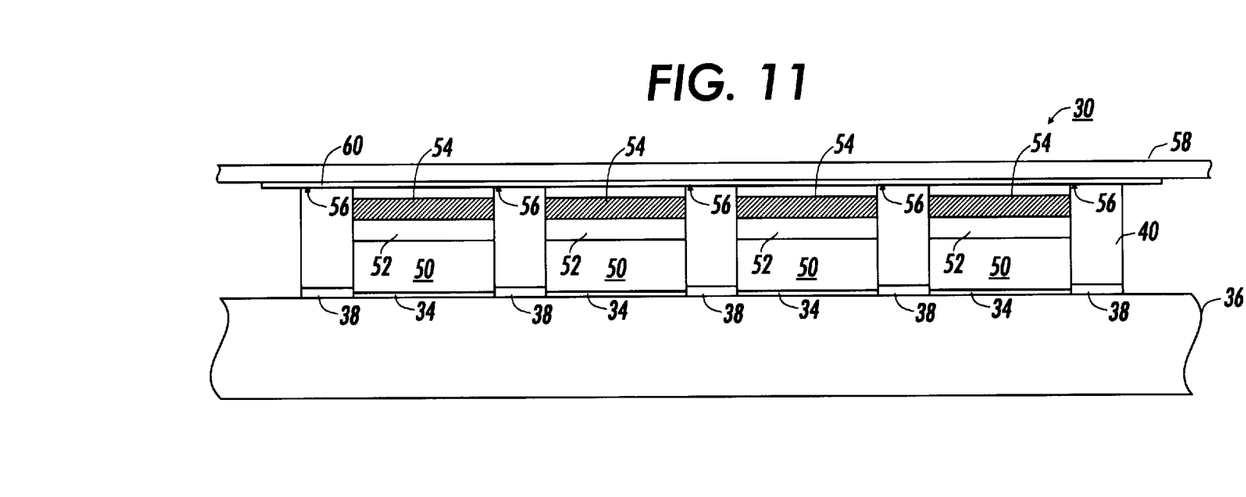
FIGS. 11 and 12 show the process of applying adhesive to the wall structure of FIG. 10.
Figure 12:
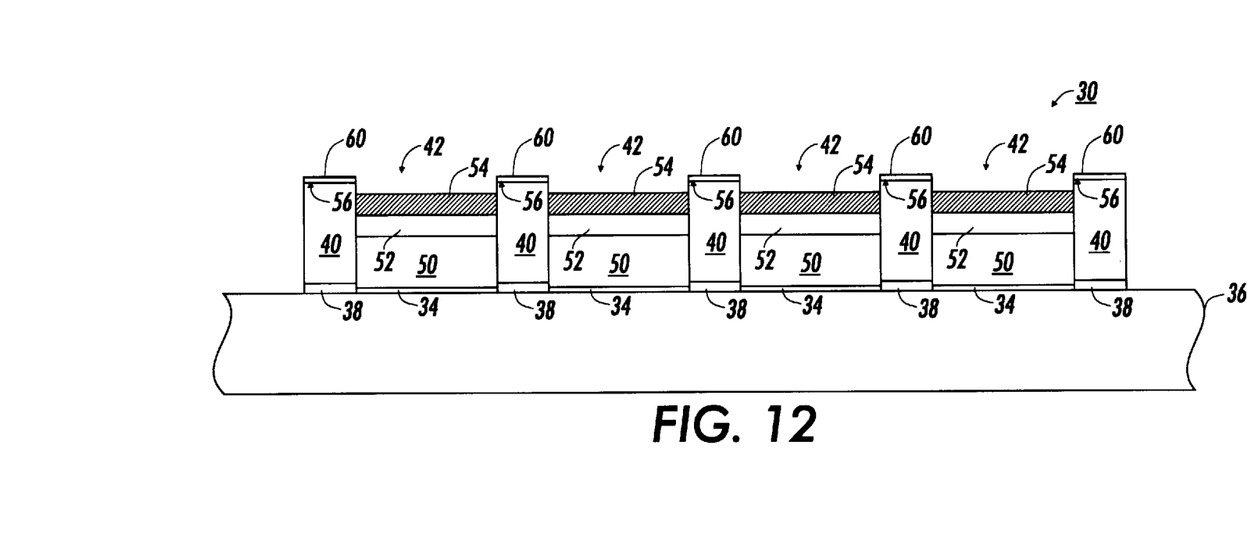

Subsequently, a layer of adhesive is applied to the wall structure 40 on surface 56. In order to apply adhesive only to the surface 56 of the polyimide, first adhesive is applied to a sheet of mylar by spin coating. For example, 1 ml of Epon (adhesive) will be placed over a sheet of mylar and it will be evenly spread over the mylar by spinning. Then, referring to FIG. 11, the sheet of mylar 58 will be placed on the polyimide surface 56 with Epon facing the surface 56. A roller will be used to roll over the mylar which would transfer Epon from the mylar to the surface 56. Then, the sheet of mylar 58 will be pilled off which will leave a layer of Epon 60 with a thickness about 1 micron on the surface 56 of the wall structure 40, as shown in FIG. 12.

Figure 13:
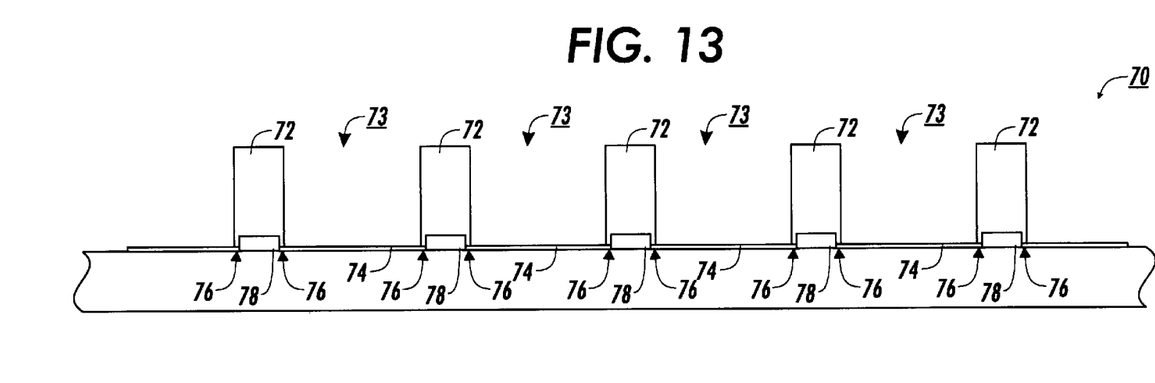
FIGS. 13–15 show the successive steps of processing a matching chip for the chip of FIG. 12.

Referring to FIG. 13, there is shown a cross sectional view of a matching integrated chip 70 which is used to be connected to the chip 30 via flip chip bonding. The matching chip 70 can be an integrated circuit or an interconnect substrate. An interconnect substrate is a chip which has connection paths on a substrate to provide connectivity to its respective flip chip.

Figure 14:
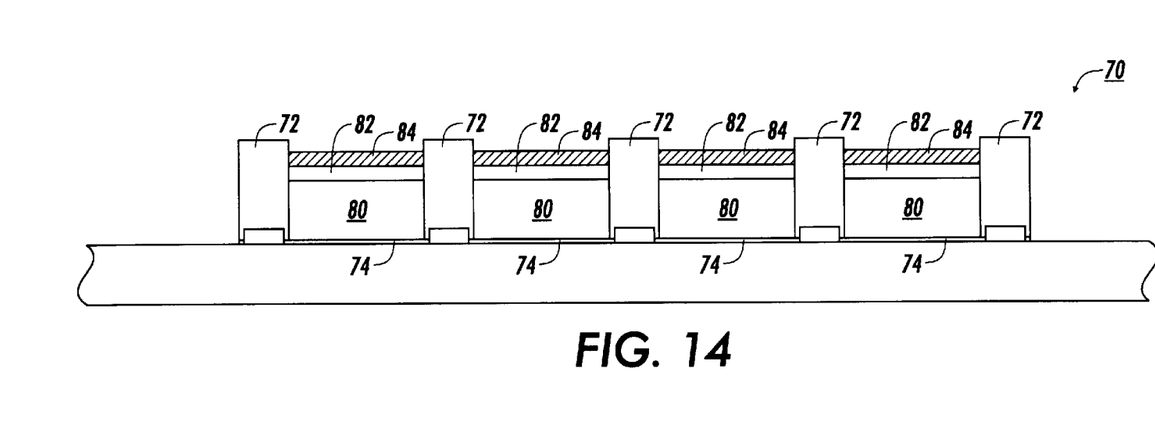

Chip 70 is built in the same manner as chip 30. However, the polyimide wall structure 72 covers a small portion 76, such as 2 microns, of the aluminum bonding pad 74. The oxide layer 78 serves the same purpose as the oxide layer 38 of FIG. 4. Referring to FIG. 14, a 4 micron layer 80 of nickel, a 1 micron layer 82 of copper and a 2 micron layer 84 of tin are placed on the aluminum bonding pads 74 in the same manner as the layers 50, 52 and 54 of FIG. 10 respectively. The solutions of nickel, copper and tin have the same pH level as the solutions used for the layers 50, 52 and 54 respectively.

It should be noted that any combination of metals which can provide a proper connection between the bonding pads 34 of chip 30 and the bonding pads 74 of the matching chip 70 can replace the metal layers 50, 52, 54, 80, 82, and 84 of this invention.

Figure 15:
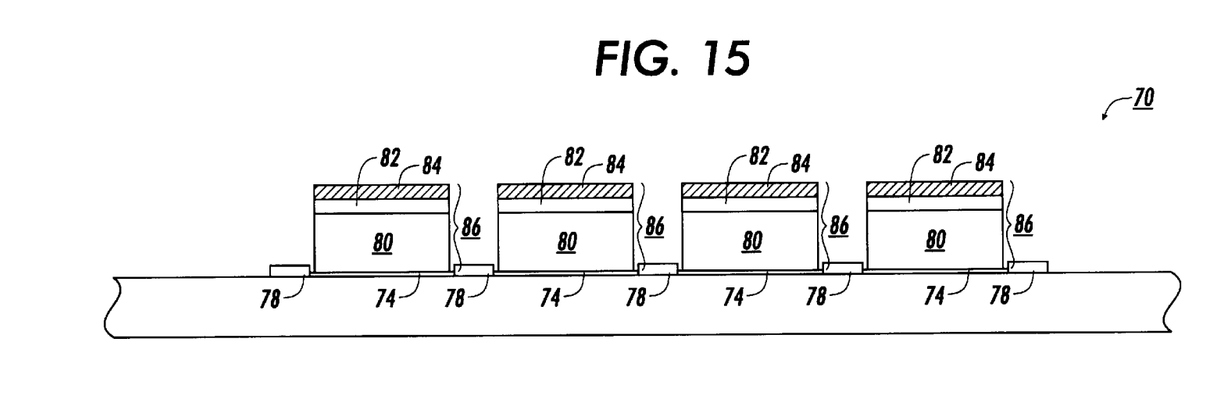

Once the layer 80 of nickel, layer 82 of copper and the layer 84 of tin are placed over the bonding pads 74, the wall structure 72 will be removed. Referring to FIG. 15, there is shown the cross sectional view of the matching chip 70 of FIG. 14 after the wall structure 72 of FIG. 14 is removed by well known dry etching technique. The layers 80, 82 and 84 stand as a connection block (interconnect) 86 over the bonding pads 74.

Figure 16:
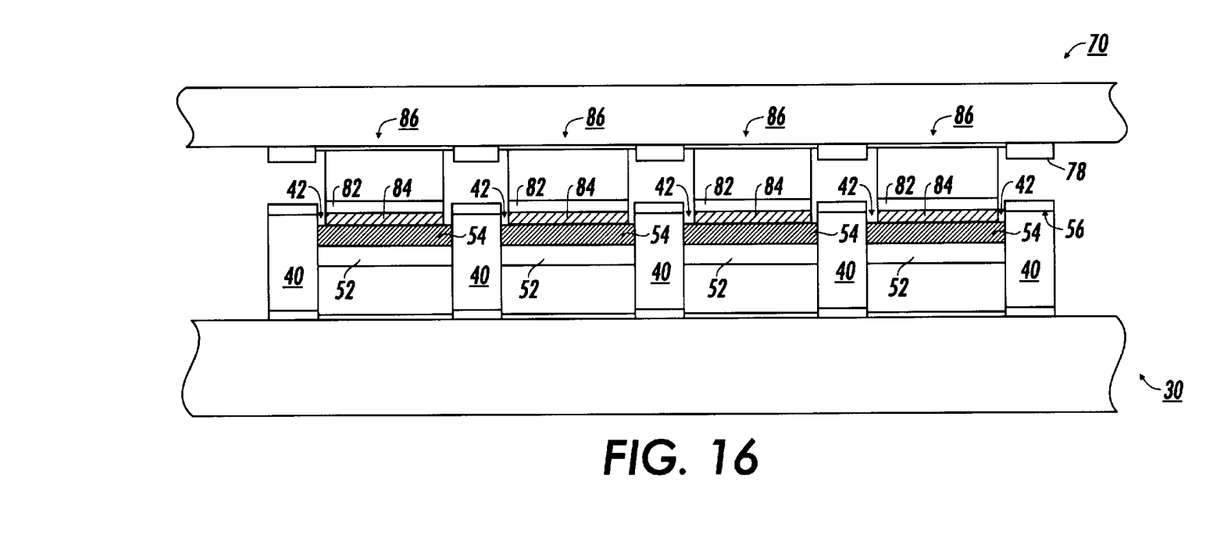
FIG. 16 shows the process of flip chip bonding between the chips of FIGS. 12 and 15.

Referring to FIG. 16, there is shown the process of flip chip bonding of chip 30 of FIG. 12 and its matching chip 70 of FIG. 15. Referring to FIG. 13, wall structure 72 covers a small portion 76 of the aluminum bonding pad 74. This caused the dimensions of the connection blocks 86 of FIG. 15 to be slightly smaller than the cavities 42 of FIG. 12. Therefore, referring to FIG. 16, connection blocks 86 of the matching chip 70 fit within the cavities 42 of the wall structure 40 of the chip 30.

After the matching chip 70 is lowered to place the connection blocks 86 into the cavities 42, thermal pressure is applied to both chips 30 and 70 to melt the tin layers 54 and 84 and to bond the matching chip 70 onto chip 30. Once the tin layers 54 and 84 are melted and collapsed, chip 70 moves down and the oxide layer 78 of the matching chip 70 moves onto surface 56.

Figure 17:
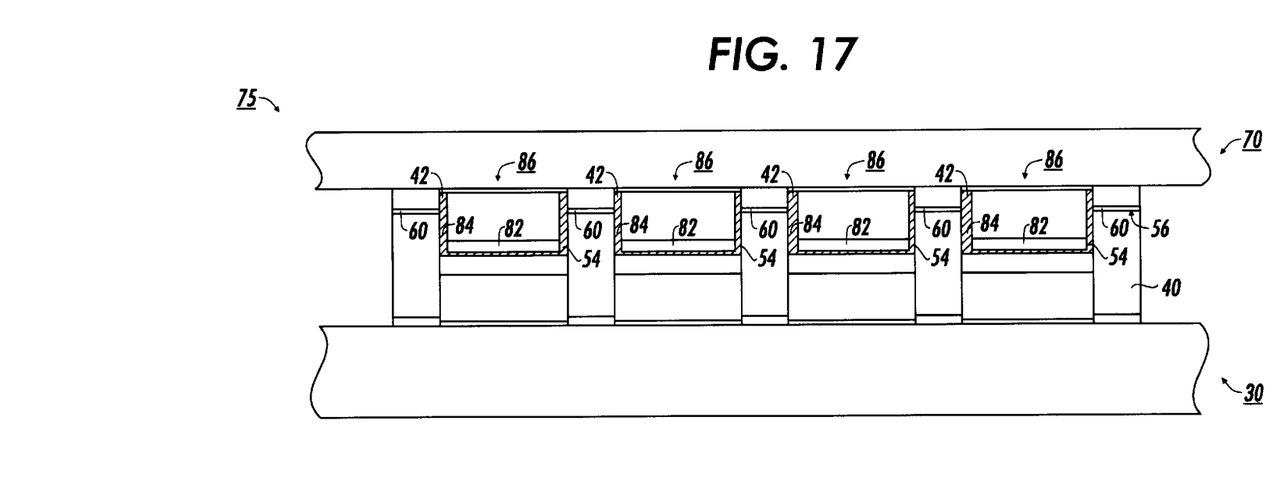
FIG. 17 shows the flip chip bonded combination of the chips of FIG. 16.

Referring to FIG. 17, there is shown a combination 75 of the two chips 30 and 70, which are bonded together via flip chip bonding technology. Referring to both FIGS. 16 and 17, in this invention, the thickness of the tin layers 54 and 84 are selected in such a manner that once a thermal pressure is applied to both chips 30 and 70, the melted tin layers 54 and 84 fill in all the gaps between the connection block 86 and the wall structure 40. The adhesive layer 60, which bonds the oxide layer 78 of the matching chip 70 to the surface 56 of the wall structure 40, is cured during the thermal compression bonding. This step seals the bonding structure.

Figure 18:
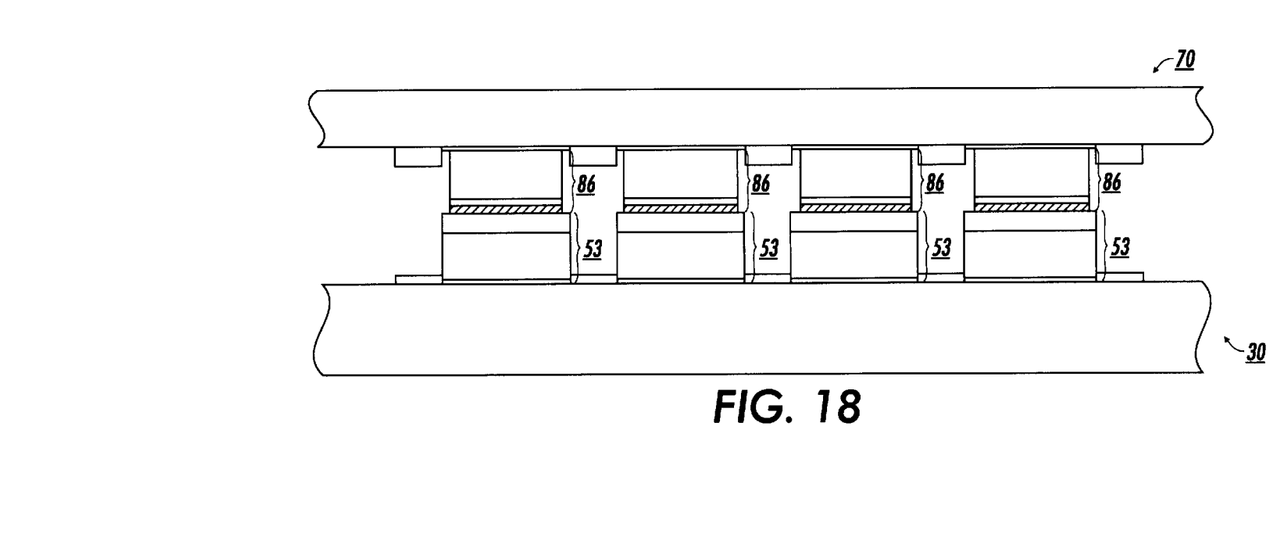
FIG. 18 shows the flip chip bonded combination of two chips where the polyimide wall structure of both chips are removed.

Referring to FIG. 18, if one desires, the wall structure 40 of FIG. 12 can be removed and the connection blocks 86 of the matching chip 70 can be connected to the connection blocks 53 of the chip 30 without having the wall structure 40. However, the flip chip bonding with the wall structure 40, shown in FIGS. 16 and 17, is the preferred embodiment of this invention.

It should be noted that the connection blocks replace the solder bumps of the conventional flip chip bonding technology. Typically, the solder bumps solidify in a generally spherical shape. However, the shape and the size of the conventional solder bumps are not precisely defined. The connection blocks of this invention have defined shapes and sizes.

Figure 19:
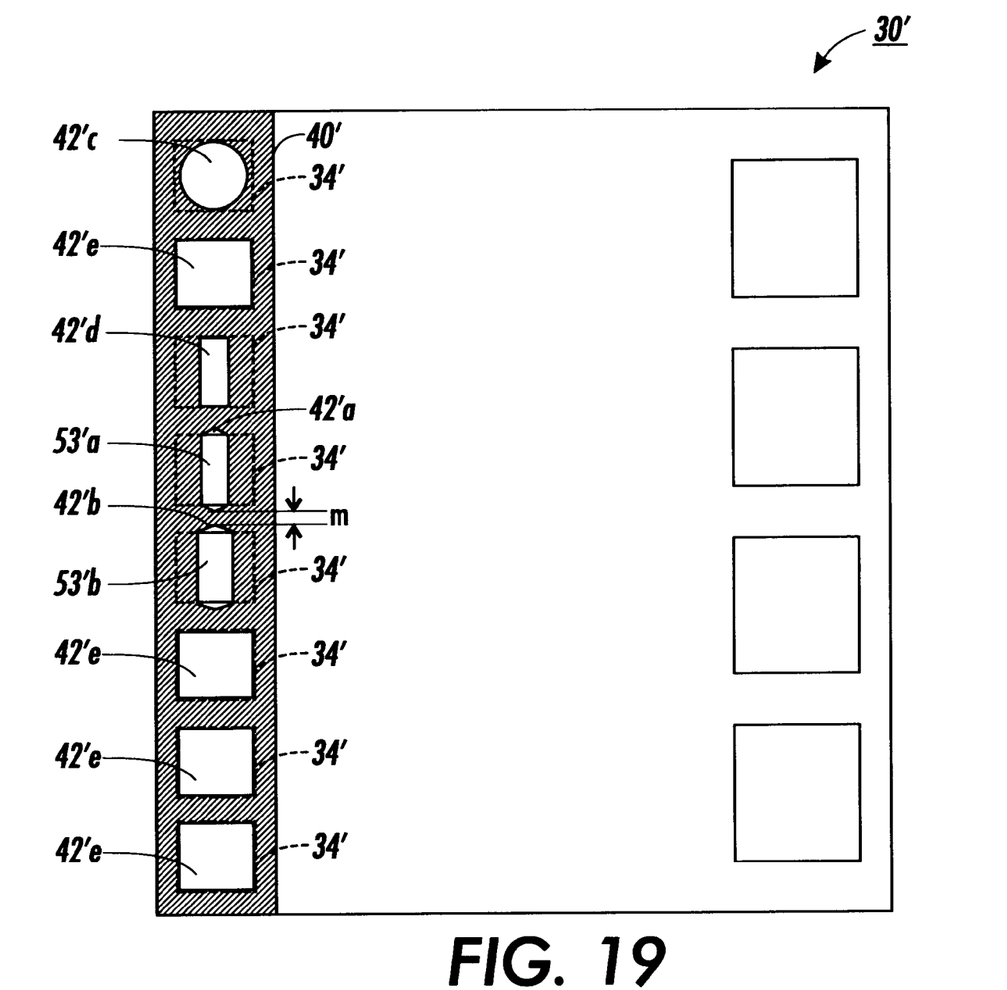
FIG. 19 shows the top view of a chip and its polyimide wall structure with cavities of different shapes and dimensions.

It should also be noted that the shapes of the connection blocks do not need to be rectangular or do not need to be in the shape of the bonding pads. Cavities 42 and 73 can be designed to create any desired shape for the connection blocks 53 and 86. For example, the cavities 42 of the wall structure 40 of FIG. 12 and the cavities 73 of the wall structure 72 of FIG. 13 can have cylindrical shape and therefore the connection blocks 53 and 86 of FIGS. 12 and 15 can be cylindrical. Referring to FIG. 19, there is shown a wall structure 40' which has cavities 42' with different shaped.

In addition, the dimensions and shape of each connection block do not need to be identical to those of the other connection blocks. For example, in FIG. 19, the wall structure 40' has cavities 42' with different defined shapes which cause the dimensions and the shape of each connection block 53' to be different than the rest of the connection blocks 53'. In the same manner, the dimensions and the shapes of the connection blocks of the matching chip do not need to be identical to those of the other connection blocks of the same chip or the connecting chip.

Furthermore, the cavities 42' can be created in such a manner that the openings of the cavities such as $42_a'$ and $42_b'$ to cross the boundaries of the bonding pads 34'. This provides connection blocks, which cross the boundaries of their bonding pad 34'. However, the degree of crossing the boundaries of the bonding pads 34' is controlled through the design of the wall structure 40' which does not allow the adjacent connection blocks to interfere with each other. In order to have connection blocks crossing the boundaries of the bonding pads 34', the narrowest width m between the openings of two adjacent cavities $42a'$ and $42b'$ should allow enough thickness for a sturdy polyimide wall.

Figure 20:
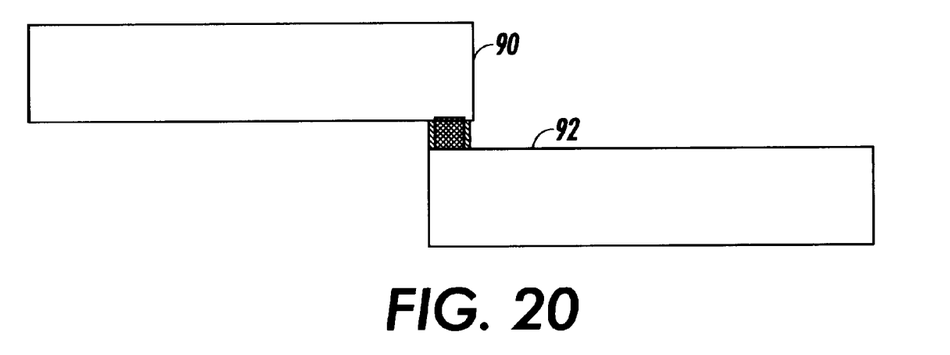
FIG. 20 shows one application of the structure of this invention.
Figure 21:
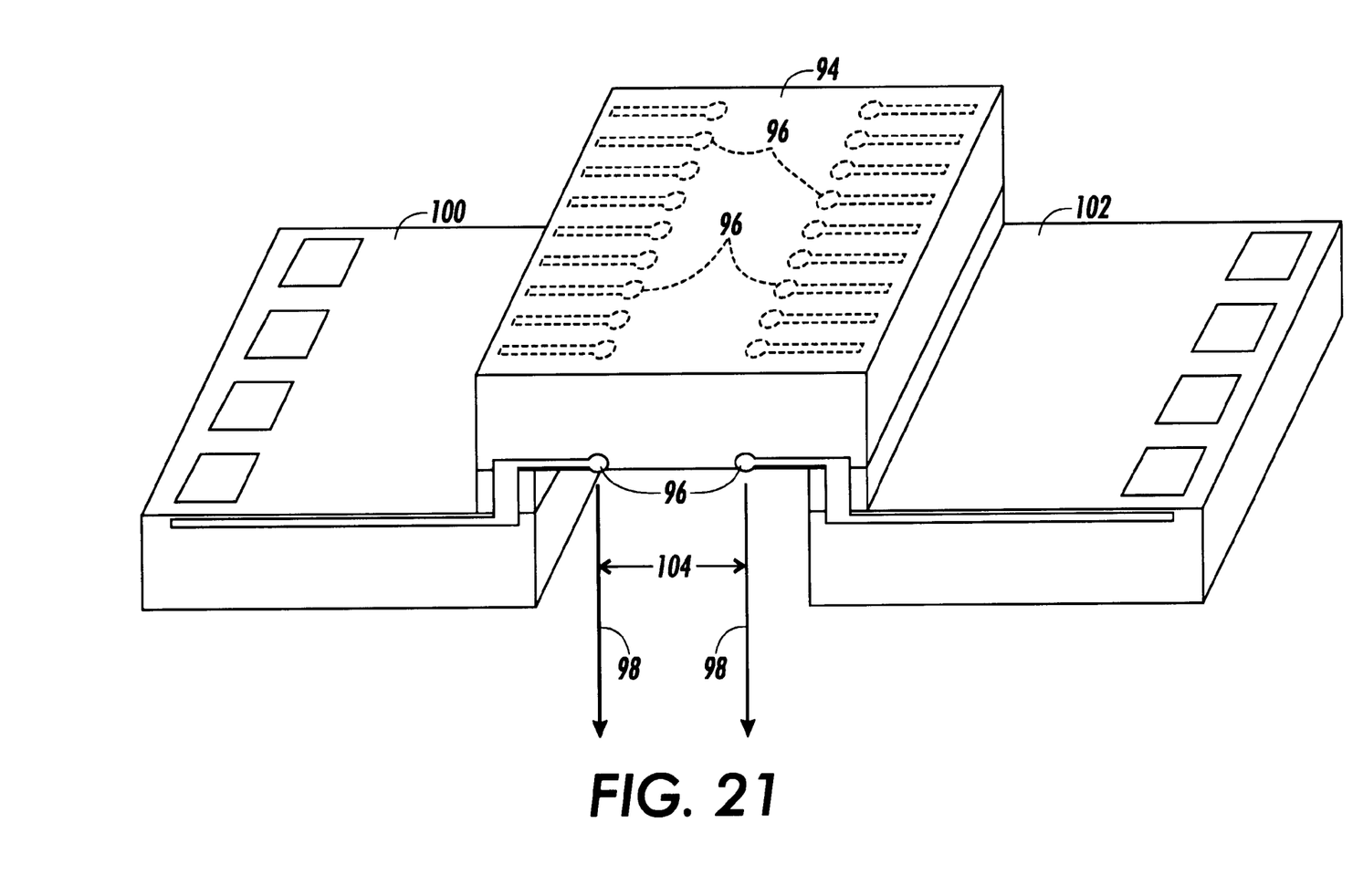
FIG. 21 shows an alternative application of the structure of this invention.

The flip chip bonding structure of this invention can be used in different ways. For example, referring to FIG. 20, there are shown two chips 90 and 92 which are bonded together only at one edge. Referring to FIG. 21, there is shown a laser diode chip 94 with a plurality of laser diodes 96, which emit light beams 98. The laser diode chip 94 is bonded to two driver chips 100 and 102 in such a manner that the driver chips 100 and 102 do not block the lasing area 104 of the laser chip 94.

Although the disclosed embodiments of this invention can be used with any size bonding pads, they specifically provide a way to achieve fabricating interconnections for bonding pads with a pitch less than 15 microns.

It should be noted that numerous changes in details of construction and the combination and arrangement of elements may be resorted to without departing from the true spirit and scope of the invention as hereinafter claimed.

I claim:

1. A process for creating a flip chip bonded combination comprising the steps of:

a. creating a plurality of bonding pads with a pitch less than 15 microns on a first integrated circuit and on a second integrated circuit;

b. applying a layer of negative photoimagable polyimide over said first integrated circuit;

c. patterning said polyimide on said first integrated circuit by photolithography to create a first wall structure around each one of said plurality of bonding pads of a said first integrated circuit;

d. creating a first connection means over each one of said plurality of bonding pads within said first wall structure;

e. applying a layer of negative photoimagable polyimide over said second integrated circuit;

f. patterning said polyimide on said second integrated circuit by photolithography to create a second wall structure around each one of said plurality of bonding pads of said second integrated circuit;

g. creating a second connection means over each one of said plurality of bonding pads within said second wall structure;

h. removing said second wall structure;

i. placing each of said second connection means partially within said first wall structure to contact said respective first connection means; and j. creating electrical connection between two respective connection means within said first wall structure.

2. The process in claim 1, wherein said first connection means and said second connection means each further comprises a layer of nickel over said respective bonding pad, a layer of copper over said layer of nickel, and a layer of tin over said layer of copper.

3. The process in claim 1, wherein said plurality of bonding pads of said first integrated circuit and said second integrated circuit have a first shape and said first wall structure and said second wall structure have a second shape.

4. The process in claim 1, wherein said step of creating electrical connection uses thermal compression.

5. The process in claim 1 further comprises a step after step d and prior to step i for placing an adhesive layer over said first wall structure.

6. The process in claim 1, wherein step h further comprises removing first wall structure.

7. A process for creating a flip chip bonded combination comprising the steps of:

a. creating a plurality of bonding pads with a pitch less than 15 microns on an integrated circuit and on an interconnect substrate;

b. applying a layer of negative photoimagable polyimide over said integrated circuit;

c. patterning said polyimide on said integrated circuit by photolithography to create a first wall structure around each one of said plurality of bonding pads of a said integrated circuit;

d. creating a first connection means over each one of said plurality of bonding pads within said first wall structure;

e. applying a layer of negative photoimagable polyimide over said interconnect substrate;

f. patterning said polyimide on said interconnect substrate by photolithography to create a first wall structure around each one of said plurality of bonding pads of a said interconnect substrate;

g. creating a second connection means over each one of said plurality of bonding pads within said second wall structure;

h. removing said second wall structure;

i. placing each of said second connection means partially within said first wall structure to contact said respective first connection means; and j. creating electrical connection between two respective connection means within said first wall structure.

8. The process in claim 7, wherein said first connection means and said second connection means each further comprises a layer of nickel over said respective bonding pad, a layer of copper over said layer of nickel, and a layer of tin over said layer of copper.

9. The process in claim 7, wherein said plurality of bonding pads of said integrated circuit and said interconnect substrate have a first shape and said first wall structure and said second wall structure have a second shape.

10. The process in claim 7, wherein said step of creating electrical connection uses thermal compression.

11. The process in claim 7 further comprises a step after step d and prior to step i for placing an adhesive layer over said first wall structure.

12. The process in claim 7, wherein step h further comprises removing first wall structure.

* * * * *